(12) United States Patent
Kim et al.

(10) Patent No.: US 8,823,119 B2
(45) Date of Patent: Sep. 2, 2014

(54) MAGNETIC DEVICE HAVING A METALLIC GLASS ALLOY

(71) Applicants: Ki-joon Kim, Hwaseong-si (KR); Hyung-joon Kwon, Seongnam-si (KR)

(72) Inventors: Ki-joon Kim, Hwaseong-si (KR); Hyung-joon Kwon, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 29 days.

(21) Appl. No.: 13/682,737

(22) Filed: Nov. 21, 2012

(65) Prior Publication Data

US 2013/0234267 A1 Sep. 12, 2013

(30) Foreign Application Priority Data

Mar. 9, 2012 (KR) .................. 10-2012-0024503

(51) Int. Cl.
*H01L 29/82* (2006.01)
*H01L 27/22* (2006.01)
*H01L 43/08* (2006.01)
*H01L 43/10* (2006.01)

(52) U.S. Cl.
CPC .............. *H01L 29/82* (2013.01); *H01L 27/228* (2013.01); *H01L 43/10* (2013.01); *H01L 43/08* (2013.01)
USPC ........... 257/421; 257/422; 257/423; 257/424; 257/427; 257/E29.323; 438/3; 365/157; 365/158; 365/171; 365/172; 365/173; 360/324.2; 360/326

(58) Field of Classification Search
USPC ............... 257/421–427, E29.323; 438/3; 365/157–158, 171–173; 360/324–326
See application file for complete search history.

(56) References Cited

U.S. PATENT DOCUMENTS

| 5,466,639 | A | 11/1995 | Ireland |
| 6,965,138 | B2 | 11/2005 | Nakajima et al. |
| 6,984,529 | B2 | 1/2006 | Stojakovic et al. |
| 7,696,551 | B2 | 4/2010 | Xiao et al. |
| 7,863,060 | B2 | 1/2011 | Belen et al. |
| 2004/0127054 | A1 | 7/2004 | Lee et al. |
| 2005/0170533 | A1* | 8/2005 | Lee et al. ............. 438/3 |
| 2005/0185454 | A1* | 8/2005 | Brown et al. ........ 365/171 |
| 2006/0098354 | A1* | 5/2006 | Parkin ................. 360/324.2 |
| 2008/0211055 | A1 | 9/2008 | Assefa et al. |
| 2010/0304504 | A1 | 12/2010 | Shinde et al. |
| 2010/0308012 | A1 | 12/2010 | Yamamoto |
| 2011/0204459 | A1 | 8/2011 | Gaidis |

FOREIGN PATENT DOCUMENTS

KR 1020100076556 A 7/2010

* cited by examiner

*Primary Examiner* — Jami M Valentine
(74) *Attorney, Agent, or Firm* — Renaissance IP Law Group LLP

(57) ABSTRACT

A magnetic body structure including: a magnetic layer pattern; and a conductive pattern including a metallic glass alloy and covering at least a portion of the magnetic body structure.

11 Claims, 10 Drawing Sheets

MAGNETIC DEVICE HAVING A METALLIC GLASS ALLOY

CROSS-REFERENCE TO RELATED APPLICATIONS

This application claims the benefit of Korean Patent Application No. 10-2012-00024503, filed on Mar. 9, 2012, in the Korean Intellectual Property Office, the disclosure of which is incorporated herein in its entirety by reference.

BACKGROUND

The inventive concept relates to a magnetic device, and, and more particularly, to a magnetic device including a magnetic layer and a method of manufacturing the same.

Much research has been conducted to develop electronic devices using magnetic resistance characteristics of magnetic tunnel junctions (MTJs). In particular, special attention has been given to a spin transfer torque (STT)-MRAM that stores information using a spin transfer torque phenomenon, i.e., inducing magnetization reversal by applying a spin-polarized current to an MTJ cell to facilitate the miniaturization of an MTJ cell of a highly-integrated magnetic random access memory (MRAM). To form a highly-integrated STT-MRAM, a technique for forming a reliable and very small size MTJ structure may be needed.

SUMMARY

The inventive concept provides a magnetic device including a material layer that improves a critical dimension (CD) of a plurality of magnetic patterns formed on a substrate in manufacturing a highly-integrated, high-density magnetic device.

According to an aspect of the inventive concept, a magnetic device includes a magnetic body structure comprising a magnetic layer pattern; and a conductive pattern including a metallic glass alloy and covering at least a portion of the magnetic body structure.

The metallic glass alloy includes at least one first element chosen from Group 1B, Group 2A, Group 3A, Group 4A, and Group 8B, and the at least one first element includes a major component element of about 40 to about 80 atom %.

The metallic glass alloy may include a hardness of at least 1000 MPa and/or a fracture toughness of at least 10 MPam$^{1/2}$.

The conductive pattern may include a first layer including the metallic glass alloy and a second layer including a crystalline metal.

A magnetic device according to another aspect of the inventive concept includes: a magnetic body structure comprising a magnetic layer pattern and a tunneling barrier, the tunneling barrier having a first width in a horizontal direction, and a conductive pattern formed on the magnetic body structure, having a second width substantially equal to or smaller than the first width in the horizontal direction, and including a metallic glass alloy.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
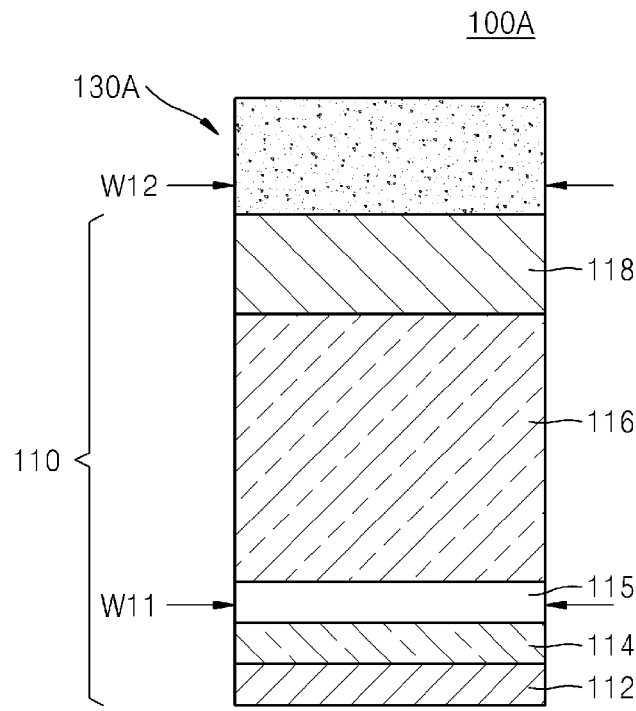
FIG. 1A is a cross-sectional view of a magnetic device according to an embodiment of the inventive concept.

Expressions such as "at least one of," when preceding a list of elements, modify the entire list of elements and do not modify the individual elements of the list.

Example embodiments of the inventive concept will be described more fully with reference to the accompanying drawings. Like reference numerals in the drawings refer to like elements, and redundant descriptions thereof are omitted.

Reference will now be made in detail to exemplary embodiments, and examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments.

It will be understood that, although the terms 'first', 'second', 'third', etc. may be used herein to describe various elements, components, regions, layers and/or sections, these elements, components, regions, layers and/or sections should not be limited by these terms. These terms refer to a particular order, rank, or superiority and are only used to distinguish one element, component, region, layer or section from another element, component, region, layer or section. Thus, a first element, component, region, layer or section discussed below could be termed a second element, component, region, layer or section without departing from the teachings of the example embodiment. For example, a first element may be referred to as a second element, and similarly, a second element may be referred to as a first element without departing from the scope of protection of the inventive concept.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

If any embodiment is implemented otherwise, a particular process may be performed differently from the described order. For example, two continuously-described processes may be substantially simultaneously performed or in an opposite order to the described order.

In the drawings, for example, illustrated shapes may be deformed according to fabrication technology and/or tolerances. Therefore, the exemplary embodiments of the present invention are not limited to certain shapes illustrated in the present specification, and may include modifications of shapes caused in fabrication processes.

FIG. 1A is a cross-sectional view of a magnetic device 100A according to an embodiment of the inventive concept.

The magnetic device 100A includes a magnetic body structure 110 and a conductive pattern 130A covering a top surface of the magnetic body structure 110. The conductive pattern 130A includes a metallic glass alloy.

The magnetic body structure 110 includes a lower electrode 112, a lower magnetic layer pattern 114, a tunneling barrier 115, an upper magnetic layer pattern 116, and a conductive capping layer pattern 118 which are sequentially stacked in a vertical direction.

In some embodiments, at least one of the lower magnetic layer pattern 114 and the upper magnetic layer pattern 116 may include at least one material chosen from Co/Pd, Co/Pt, Co/Ni, Fe/Pd, Fe/Pt, MgO, PtMn, IrMn, a CoFe alloy, and a CoFeB alloy.

The tunneling barrier 115 has a first width W11 in a horizontal direction. Also, the conductive pattern 130A, including the metallic glass alloy, has a second width W12 which may be substantially equal to or smaller than the first width W11 in the horizontal direction. In FIG. 1A, the first width W11 of the tunneling barrier 115 may be similar to the second width W12 of the conductive pattern 130A. However, the inventive concept is not limited thereto. For example, the magnetic body structure 110 may have a width increasing in a direction from the conductive capping layer pattern 118 to the lower electrode 112. Accordingly, the magnetic body structure 110 may have a slanted side wall. Also, the first width W11 of the tunneling barrier 115 may be greater than the second width W12 of the conductive pattern 130A.

The lower electrode 112 may include at least one material chosen from Ti, Ta, Ru, TiN, TaN, and W. In some embodiments, the lower electrode 112 may have a bi-layer structure chosen from Ti/Ru, Ta/Ru, TiN/Ru, TaN/Ru, and TiN/Ru. In some embodiments, the lower electrode 112 may have a thickness of about 20 to about 50 Å.

The lower magnetic layer pattern 114 may include at least one chosen from Fe, Co, Ni, Pd, and Pt. In some embodiments, the lower magnetic layer pattern 114 consists of a Co-M1 alloy (where M1 is at least one metal chosen from Pt, Pd, and Ni), or an Fe-M2 alloy (where M2 is at least one metal chosen from Pt, Pd, and Ni). In another embodiment, the lower magnetic layer pattern 114 may further include at least one material chosen from B, C, Cu, Ag, Au, and Cr. In some embodiments, the lower magnetic layer pattern 114 may have a thickness of about 10 to about 50 Å.

The upper magnetic layer pattern 116 may include at least one chosen from Co, a Co-M1 alloy (where M1 is at least one chosen from Pt, Pd, and Ni), an Fe-M2 alloy (where M2 is at least one chosen from Pt, Pd, and Ni), Ru, Ta, Cr, and Cu. In some embodiments, the upper magnetic layer pattern 116 may have a thickness of about 30 to about 500 Å.

In some embodiments, at least one of the lower magnetic layer pattern 114 and the upper magnetic layer pattern 116 may include a perpendicular magnetic anisotropy (PMA) material. In some embodiments, at least one of the lower magnetic layer pattern 114 and the upper magnetic layer pattern 116 may have a synthetic anti-ferromagnetic (SAF) structure in which a Ru intermediate layer is inserted into a ferromagnetic stack structure. For example, the SAF structure may have a multi-layer structure of CoFeB/Ta/(Co/Pt)$_m$/Ru/(Co/Pd)$_n$ (where m and n are natural numbers). However, various other structures besides an SAF structure may also be used according to an aspect of the inventive concept.

The tunneling barrier 115 interposed between the lower magnetic layer pattern 114 and the upper magnetic layer pattern 116 may include, for example, MgO, $Al_2O_3$, $B_2O_3$, or $SiO_2$. In some embodiments, the tunneling barrier 115 may have a thickness of about 5 to about 30 Å.

The conductive capping layer pattern 118 may include at least one material chosen from Ti, Ta, Ru, TiN, TaN, and W. In some embodiments, the conductive capping layer pattern 118 may have a bi-layer structure chosen from Ti/Ru, Ta/Ru, TiN/Ru, TaN/Ru, and TiN/Ru. In some embodiments, the conductive capping layer pattern 118 may have a thickness of about 20 to about 50 Å.

The structures of the lower magnetic layer pattern 114 and the upper magnetic layer pattern 116 of the magnetic body structure 110 are not limited to the description presented above, and the lower magnetic layer pattern 114 and the upper magnetic layer pattern 116 of the magnetic body structure 110 may have various modified structures. For example, the description about the lower magnetic layer pattern 114 may be applicable to the upper magnetic layer pattern 116, and also, the description about the upper magnetic layer pattern 116 may be applicable to the lower magnetic layer pattern 114.

In some embodiments, the magnetic body structure 110 may be used to form a vertical magnetization-type magnetic tunnel junction (MTJ) device or perpendicular MTJ device. In some other embodiments, embodiments of the present disclosure may be also applicable to in-plane MTJ device.

The conductive capping layer pattern 118 and the conductive pattern 130A of the magnetic device 100A may constitute an upper electrode.

The conductive pattern 130A may include an alloy having an amorphous atomic structure that does not have a distinguished particular pattern, and may have a multi-component chemical composition. The conductive pattern 130A may include an alloy including three or more different elements.

In some embodiments, the conductive pattern 130A may include at least one first element chosen from Group 1B, Group 2A, Group 3A, Group 4A, and Group 8B. In some embodiments, the at least one first element includes a major or a majority component in an amount of about 40 to about 80 atom %. For example, the first element may include at least one element chosen from Zr, Pd, Pt, Fe, Cu, Mg, and La.

In some embodiments, the conductive pattern 130A may further include, in addition to the at least one first element, at least one second element chosen from Group 3B, Group 4B, Group 5A, Group 5B, Group 6A, and the lanthanide series.

In some embodiments, the conductive pattern 130A may include at least one first element chosen from Zr, Pd, Pt, Fe, Cu, Mg, and La and included in an amount of about 40 to about 80 atom %, at least one second element chosen from Si, Cu, Al, Mo, C, P, Ti, Be, and Zr and included in an amount of about 10 to about 40 atom %, and at least one third element chosen from Cu, Al, Ni, Si, Tb, Co, B, Er, Cr, Mo, C, P, Hf, Ti, Ta, Au, Ag, Ge, Ce, Ca, Gd, Nb, and V and that is included in an amount of about 0.1 to about 10 atom %. In this regard, the first element, the second element, and the third element comprise different elements from each other.

In some embodiments, the conductive pattern 130A may include a metallic glass that has Zr as a major or majority component. The metallic glass alloy included in the conductive pattern 130A may have a chemical formula of $Zr_aCu_bAl_c$ $Ni_aSi_eTi_fBe_gV_hNb_i$ (where a, b, c, d, e, f, g, h, and i respectively satisfy, in units of atom %, 40≤a≤80, 10≤b≤35, 0≤c≤15, 0≤d≤15, 0≤e≤10, 0≤f≤15, 0≤g≤30, 0≤h≤10, 0≤i≤5, and a+b+c+d+e+f+g+h+i=100.) For example, the metallic glass alloy included in the conductive pattern 130A may have a chemical formula of $Zr_{75}Cu_{19}Al_6$, $Zr_{47}Cu_{31}Al_{13}Ni_9$, $Zr_{61}Cu_{17.5}Al_{7.5}Ni_{10}Si_4$, $Zr_{60}Al_{13}Ni_{10}Ti_{13}V_4$, $Zr_{55}Cu_{30}Al_{10}Ni_5$, $Zr_{41.2}Cu_{12.5}Ni_{10}Ti_{13.8}Be_{22.5}$, $Zr_{46.75}Cu_{7.5}Ni_{10}Ti_{8.25}Be_{27.5}$, $Zr_{52.5}Cu_{17.9}Al_{10}Ni_{14.6}Ti_5$, or $Zr_{58.5}Cu_{15.6}Al_{10.3}Ni_{12.8}Nb_{2.8}$.

In other embodiments, the metallic glass alloy included in the conductive pattern 130A may include a metallic glass that has Pd as a major component. The metallic glass alloy included in the conductive pattern 130A may have a chemical formula of $Pd_aSi_bCu_c$ (where a, b, and c, respectively satisfy, in units of atom %, 70≤a≤80, 10≤b≤20, 5≤c≤10, and a+b+c=100), or $Pd_aSi_bP_cAg_dGe_e$ (where a, b, c, d, and e, respectively satisfy, in units of atom %, 70≤a≤80, 7≤b≤15, 5≤c≤10, 0.5≤d≤5, 0.5≤e≤5, and a+b+c+d+e=100). For example, the metallic glass alloy included in the conductive pattern 130A may have a chemical formula of $Pd_{76}Si_{17}Cu_7$ or $Pd_{79}Si_{9.5}P_6Ag_{3.5}Ge_2$.

In other embodiments, the metallic glass alloy included in the conductive pattern 130A may include a metallic glass that has Pt as a major or majority component. The metallic glass alloy may have a chemical formula of $Pt_aP_bCu_cNi_d$ (where a, b, c, and d, respectively satisfy, in units of atom %, 40≤a≤80, 5≤b≤35, 5≤c≤20, 1≤d≤10, and a+b+c+d=100.) For example, the metallic glass alloy may have a chemical formula of $Pt_{57.5}P_{22.5}Cu_{14.7}Ni_{5.3}$.

In other embodiments, the metallic glass alloy included in the conductive pattern 130A may include a metallic glass that has Fe as a major or majority component. The metallic glass alloy may have a chemical formula of $Fe_aC_bMo_cB_dCo_eP_fCr_gNi_hEr_i$ (where a, b, c, d, e, f, g, h, and i, respectively satisfy, in units of atom %, 40≤a≤80, 1≤b≤20, 1≤c≤20, 1≤d≤10, 0≤e≤10, 0≤f≤20, 0≤g≤10, 0≤h≤10, 0≤i≤5, and a+b+c+d+e+f+g+h=100.) For example, the metallic glass alloy may have a chemical formula of $Fe_{58}C_{15}Mo_{14}B_6Co_{6.5}Er_{0.5}$, $Fe_{66}C_{10}Mo_{10}B_3P_8Cr_3$, or $Fe_{70}C_5Mo_5B_{2.5}P_{12.5}Ni_5$.

In other embodiments, the metallic glass alloy may include a metallic glass that has Cu as a major or majority component. The metallic glass alloy may have a chemical formula of $Cu_aZr_bHf_cTi_d$ (where a, b, c, and d, respectively satisfy, in a unit of atom %, 40≤a≤80, 1≤b≤20, 1≤c≤20, 1≤d≤20, and a+b+c+d=100). For example, the metallic glass alloy may have a chemical formula of $Cu_{60}Zr_{20}Hf_{10}Ti_{10}$.

In other embodiments, the metallic glass alloy may include a metallic glass that has Mg as a major or majority component. The metallic glass alloy may have a chemical formula of $Mg_aCu_bTb_c$ (where a, b, and c, respectively satisfy, in units of atom %, 50≤a≤80, 5≤b≤30, 1≤c≤20, and a+b+c=100.) For example, the metallic glass alloy may have a chemical formula of $Mg_{65}Cu_{25}Tb_{10}$.

In other embodiments, the metallic glass alloy may include a metallic glass that has La as a major or majority component. The metallic glass alloy may have a chemical formula of $La_aAl_bCu_cNi_dCo_e$ (where a, b, c, d, and e respectively satisfy, in units of atom %, 40≤a≤80, 5≤b≤30, 1≤c≤20, 1≤d≤10, 1≤e≤10, and a+b+c+d+e=100.) For example, the metallic glass alloy may have a chemical formula of $La_{55}Al_{25}Cu_{10}Ni_5Co_5$.

Figure 1B:
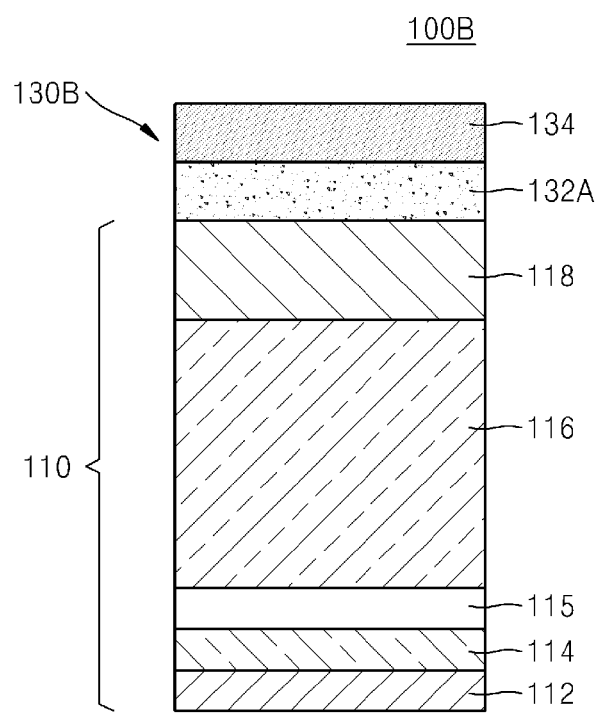
FIG. 1B is a cross-sectional view of a magnetic device according to another embodiment of the inventive concept.

FIG. 1B is a cross-sectional view of a magnetic device 100B according to another embodiment of the inventive concept. In FIGS. 1B and 1A, like reference numerals denote like elements, and herein, the description thereof will be omitted to avoid repetition.

A conductive pattern 130B includes a first layer 132A including a metallic glass alloy, and a second layer 134 including crystalline metal.

In some embodiments, the first layer 132A may be an amorphous layer formed of the same material as described with reference to the metallic glass alloy included in the conductive pattern 130A illustrated in FIG. 1A. In some embodiments, the second layer 134 may include crystalline metal. In some embodiments, the second layer 134 may include metal or metal nitride. In some embodiments, the second layer 134 may include at least one material chosen from Ru, W, TiN, TaN, Ti, and Ta. In other embodiments, the second layer 134 may have a bi-layer structure of Ru/TiN or TiN/W.

Although the conductive pattern 130B illustrated in FIG. 1B includes one first layer 132A and one second layer 134, the inventive concept is not limited thereto. For example, the conductive pattern 130B may have a multi-layer structure in which one or more amorphous layers, such as the first layer 132A, and a plurality of crystalline layers, such as the second layer 134, may be alternately stacked.

Figure 1C:
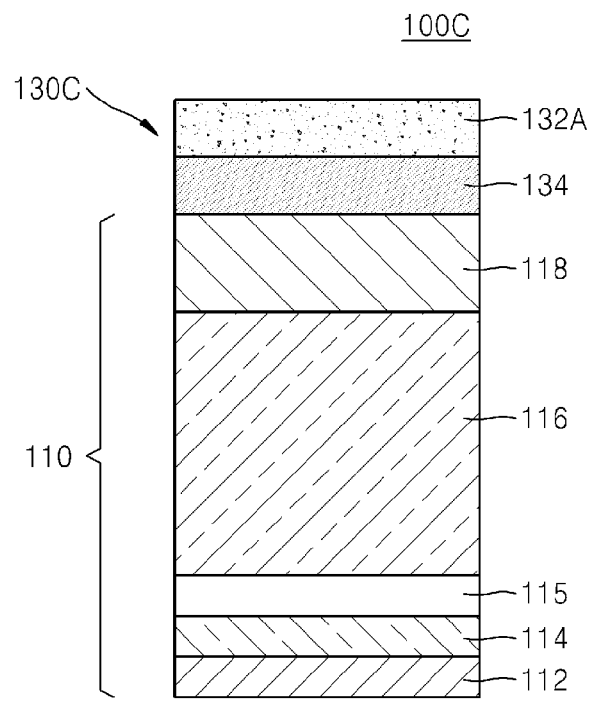
FIG. 1C is a cross-sectional view of a magnetic device according to another embodiment of the inventive concept.

FIG. 1C is a cross-sectional view of a magnetic device 100C according to still another embodiment of the inventive concept. In FIGS. 1C and 1A, like reference numerals denote like elements, and herein, the description thereof will be omitted to avoid repetition.

The magnetic device 100C includes a conductive pattern 130C. The conductive pattern 130C may be the same as in the magnetic device 100B of FIG. 1B, except that the first layer 132A including a metallic glass alloy is formed on the second layer 134 including crystalline metal. In the magnetic device 100C, the second layer 134 is formed immediately or directly on the conductive capping layer pattern 118, and accordingly, the first layer 132A is spaced apart from the magnetic body structure 110 with the second layer 134 interposed therebetween. The first layer 132A and the second layer 134 are previously described in detail above with reference to FIG. 1B.

Figure 2:
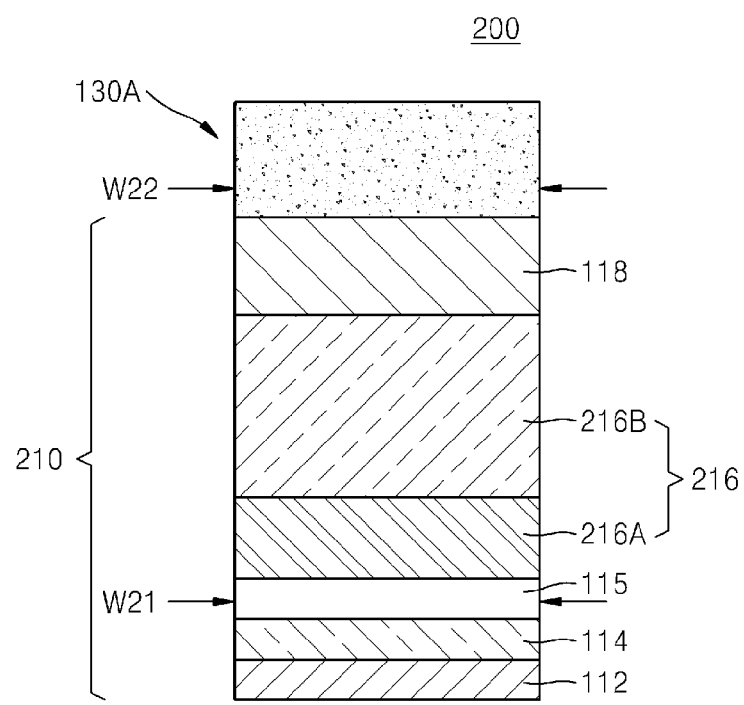
FIG. 2 is a cross-sectional view of a magnetic device according to another embodiment of the inventive concept.

FIG. 2 is a cross-sectional view of a magnetic device 200 according to another embodiment of the inventive concept. In FIGS. 2 and 1A, like reference numerals denote like elements, and herein, the description thereof will be omitted to avoid repetition.

The magnetic device 200 may include a magnetic body structure 210 and the conductive pattern 130A covering a top surface of the magnetic body structure 210. The conductive pattern 130A includes the metallic glass alloy. In some embodiments, instead of the conductive pattern 130A, as described with reference to FIG. 1B or 1C, the conductive pattern 130B or the conductive pattern 130C, each of which includes the first layer 132A including a metallic glass alloy and the second layer 134 including crystalline metal, may be formed.

The magnetic body structure 210 includes the lower electrode 112, the lower magnetic layer pattern 114, the tunneling barrier 115, an upper magnetic layer pattern 216, and the conductive capping layer pattern 118 which are sequentially stacked in a vertical direction.

The upper magnetic layer pattern 216 may include a pinned layer 216A and a pinning layer 216B which are sequentially stacked on the tunneling barrier 115.

The pinned layer 216A may include at least one ferromagnetic material chosen from Co, Fe, Pt, and Pd. The pinned layer 216A may have an SAF structure which is previously described with reference to FIG. 1A. In some embodiments, the pinned layer 216A may have a thickness of about 30 to about 50 Å.

The pinning layer 216B may include an anti-ferromagnetic material. In some embodiments, the pinning layer 216B may include at least one chosen from PtMn, IrMn, NiMn, FeMn, MnO, MnS, MnTe, $MnF_2$, $FeCl_2$, FeO, $CoCl_2$, CoO, $NiCl_2$, NiO, and Ni. In some embodiments, the pinning layer 216B may have a thickness of about 50 to about 150 Å. In some embodiments, the pinning layer 216B may be omitted from the upper magnetic layer pattern 216.

The conductive capping layer pattern 118 and the conductive pattern 130A of the magnetic device 200 may constitute an upper electrode.

In some embodiments, the magnetic body structure 210 may be used to form a horizontal magnetization-type MTJ device, i.e., in-plane MTJ device.

Figure 3:
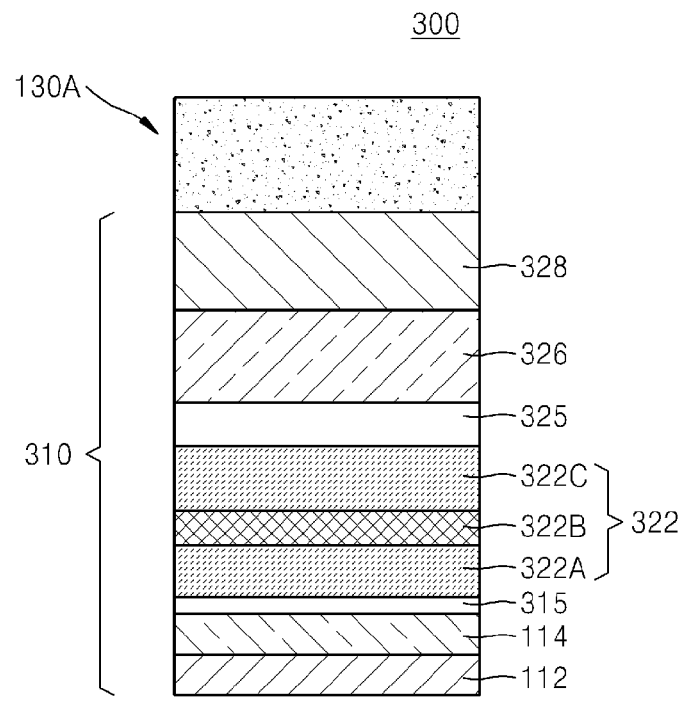
FIG. 3 is a cross-sectional view of a magnetic device according to another embodiment of the inventive concept.

FIG. 3 is a cross-sectional view of a magnetic device 300 according to another embodiment of the inventive concept. In FIGS. 3 and 1A, like reference numerals denote like elements, and herein, the description thereof will be omitted to avoid repetition.

The magnetic device 300 may include a magnetic body structure 310 and the conductive pattern 130A covering a top surface of the magnetic body structure 310. The conductive pattern 130A may include the metallic glass alloy. In some embodiments, instead of the conductive pattern 130A, as described with reference to FIG. 1B or 1C, the conductive pattern 130B or the conductive pattern 130C, each of which includes the first layer 132A including a metallic glass alloy and the second layer 134 including crystalline metal, may be formed.

The magnetic body structure 310 includes the lower electrode 112, the lower magnetic layer pattern 114, a first tunneling barrier 315, an intermediate magnetic layer pattern 322, a second tunneling barrier 325, an upper magnetic layer pattern 326, and a conductive capping layer pattern 328 which are sequentially stacked in a vertical direction.

The second tunneling barrier 325 may have a greater thickness than the first tunneling barrier 315. In some embodiments, the second tunneling barrier 325 may have a higher resistance than the first tunneling barrier 315. For example, the second tunneling barrier 325 may have a resistance that is at least 10 times greater than that of the first tunneling barrier 315. In some embodiments, the first tunneling barrier 315 and the second tunneling barrier 325 may include MgO.

The intermediate magnetic layer pattern 322 may include a CoFeB alloy layer 322A, a Ta layer 322B, and a CoFeB alloy layer 322C which are sequentially stacked as shown.

The upper magnetic layer pattern 326 may include the same material as described with reference to the upper magnetic layer pattern 116 illustrated in FIG. 1A. The conductive capping layer pattern 328 may have the same structure as described with reference to the conductive capping layer pattern 118 illustrated in FIG. 1A.

In some embodiments, the intermediate magnetic layer pattern 322 is a free layer, and the lower magnetic layer pattern 114 and the upper magnetic layer pattern 326 are pinned layers. The lower magnetic layer pattern 114 and the upper magnetic layer pattern 326 may have different structures.

The structures of the lower magnetic layer pattern 114, the intermediate magnetic layer pattern 322, and the upper magnetic layer pattern 326 of the magnetic body structure 310 are not limited to the description presented above, and the lower magnetic layer pattern 114, the intermediate magnetic layer pattern 322, and the upper magnetic layer pattern 326 of the magnetic body structure 310 may have various modified structures. For example, the description about the lower magnetic layer pattern 114 may be applicable to the upper magnetic layer pattern 326, and also, the description about the upper magnetic layer pattern 326 may apply to the lower magnetic layer pattern 114.

The conductive capping layer pattern 328 and the conductive pattern 130A of the magnetic device 300 may constitute an upper electrode.

In some embodiments, the magnetic body structure 310 may be used to form a vertical magnetization-type MTJ device, i.e., perpendicular MTJ device. Regarding the magnetic body structure 310, a spin torque switching current may be reduced if the intermediate magnetic layer pattern 322 of Ta/CoFeB/MgO is used as a free layer in a perpendicular MTJ structure.

Figure 4:
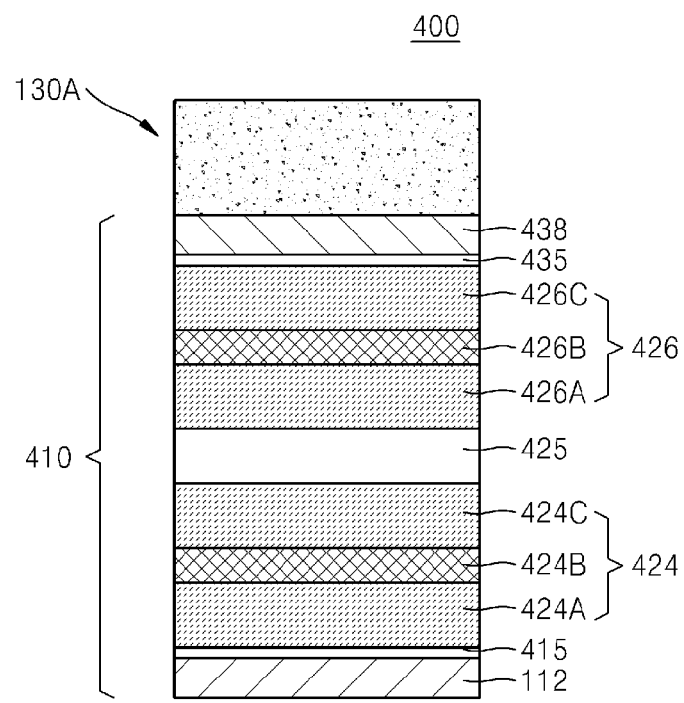
FIG. 4 is a cross-sectional view of a magnetic device according to another embodiment of the inventive concept.

FIG. 4 is a cross-sectional view of a magnetic device 400 according to another embodiment of the inventive concept. In FIGS. 4 and 1A, like reference numerals denote like elements, and herein, redundant descriptions about elements that have already been described are not presented below.

The magnetic device 400 includes a magnetic body structure 410 and the conductive pattern 130A covering a top surface of the magnetic body structure 410. The conductive pattern 130A may include the metallic glass alloy. In some embodiments, instead of the conductive pattern 130A, as described with reference to FIG. 1B or 1C, the conductive pattern 130B or the conductive pattern 130C, each of which may include the first layer 132A including a metallic glass alloy and the second layer 134 including crystalline metal, may be formed.

The magnetic body structure 410 may include the lower electrode 112, a first tunneling barrier 415, a first magnetic layer pattern 424, a second tunneling barrier 425, a second magnetic layer pattern 426, a third tunneling barrier 435, and a conductive capping layer pattern 438 which are sequentially stacked in a vertical direction.

The lower electrode 112 may be used as a seed layer to form a film thereon. In some embodiments, the lower electrode 112 may include Ta.

The second tunneling barrier 425 may have a thickness greater than those of the first tunneling barrier 415 and the third tunneling barrier 435. In some embodiments, the first tunneling barrier 415 and the second tunneling barrier 435 may have the same thickness. In some embodiments, the second tunneling barrier 425 may have a greater resistance than those of the first tunneling barrier 415 and the third tunneling barrier 435. For example, the second tunneling barrier 425 may have a resistance that is at least 10 times greater than those of the first tunneling barrier 415 and the third tunneling barrier 435. In some embodiments, each of the first tunneling barrier 415, the second tunneling barrier 425, and the third tunneling barrier 435 may include MgO.

The second tunneling barrier 425 may be interposed between the first magnetic layer pattern 424 and the second magnetic layer pattern 426. The first magnetic layer pattern 424 may include a CoFeB alloy layer 424A, a Ta layer 424B, and a CoFeB alloy layer 424C which are sequentially stacked. The second magnetic layer pattern 426 may include a CoFeB alloy layer 426A, a Ta layer 426B, and a CoFeB alloy layer 426C which are sequentially stacked. In some embodiments, the first magnetic layer pattern 424 and the second magnetic layer pattern 426 may have substantially the same thickness. In other embodiments, the first magnetic layer pattern 424 and the second magnetic layer pattern 426 may have different thicknesses.

The conductive capping layer pattern 438 may include the same material as described with reference to the conductive capping layer pattern 118 illustrated in FIG. 1A. For example, the conductive capping layer pattern 438 may include Ta.

In some embodiments, the first magnetic layer pattern 424 is a free layer, and the second magnetic layer pattern 426 is a pinned layer.

The structures of the first magnetic layer pattern 424 and the second magnetic layer pattern 426 of the magnetic body structure 410 are not limited to the description presented above, and the first magnetic layer pattern 424 and the second magnetic layer pattern 426 of the magnetic body structure 410 may have various modified structures. For example, the description about the first magnetic layer pattern 424 may be applicable to the second magnetic layer pattern 426, and also, the description about the second magnetic layer pattern 426 may be applicable to the first magnetic layer pattern 424.

The conductive capping layer pattern 438 and the conductive pattern 130A of the magnetic device 400 may constitute an upper electrode.

In some embodiments, the magnetic body structure 410 may be used to form a vertical magnetization-type MTJ device or a perpendicular MTJ device. Regarding perpendicular MTJ device, because a Ta/CoFeB/MgO/CoFeB/Ta stack structure is included in the magnetic body structure 410, a relatively high tunnel magnetoresistance ratio (TMR) may be obtained, and even when the magnetic body structure 410 has a fine line width of 20 nm or less, excellent thermal stability may be obtained and a switching current may be reduced.

Figure 5:
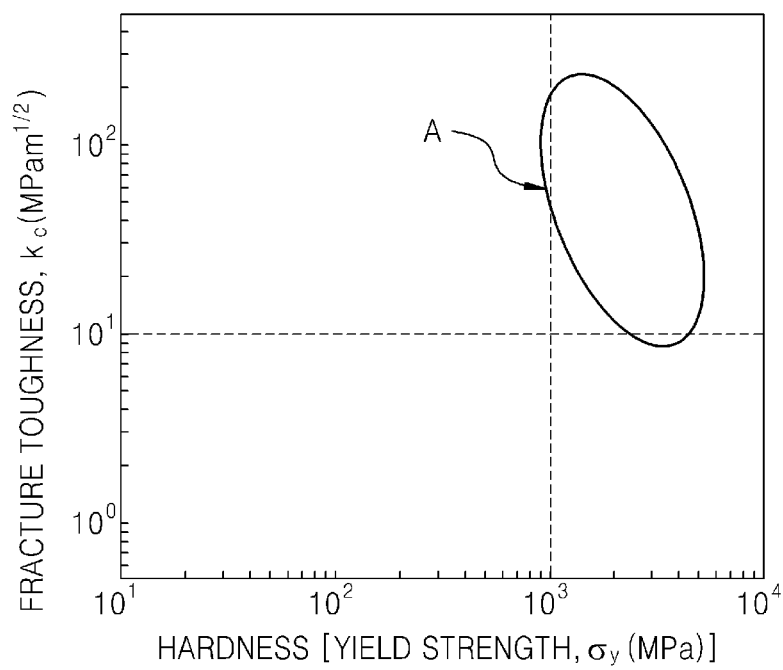
FIG. 5 is a graph showing physical characteristics of a metallic glass alloy pattern of a magnetic device according to the inventive concept.

FIG. 5 is a graph showing physical characteristics of the conductive pattern 130A including metallic glass alloy (see FIGS. 1A, and 2-4) of a magnetic device according to some embodiments.

The conductive pattern 130A may include, as indicated by region A in FIG. 5, a material having a hardness of at least 1000 MPa and/or a fracture toughness of at least 10 MPam$^{1/2}$.

FIGS. 6A to 6H are cross-sectional views illustrating a method of manufacturing a magnetic device 500 (see FIG. 6H), according to an embodiment of the inventive concept. In the present embodiment, a method of manufacturing a spin transfer torque magnetoresistive random access memory (STT-MRAM) is described below as an example of the method of manufacturing the magnetic device 500.

Figure 6A:
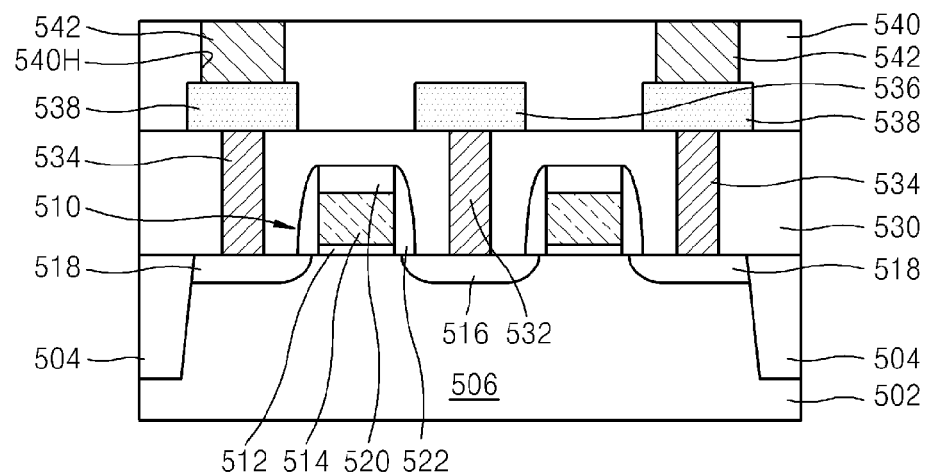
FIGS. 6A to 6H are cross-sectional views illustrating a method of manufacturing a magnetic device, according to an embodiment of the inventive concept.

Referring to FIG. 6A, a device isolation layer 504 is formed in a substrate 502 to define an active region 506, and a transistor 510 is formed on the active region 506.

In some embodiments, the substrate 502 may be a semiconductor substrate. In at least one embodiment, the substrate 502 may include Si. In other embodiments, the substrate 502 may include a semiconductor element, such as Ge, or a compound semiconductor, such as SiC, GaAs, InAs, and InP. In at least one embodiment, the substrate 502 may have a silicon-on-insulator (SOI) structure. For example, the substrate 502 may include a buried oxide layer (BOX) layer. In some embodiments, the substrate 502 may have a conductivity region, for example, a well doped with impurities, or a structure doped with impurities. The device isolation layer 504 may have a shallow trench isolation (STI) structure.

The transistor 510 may include a gate insulating film 512, a gate electrode 514, a source region 516, and a drain region 518. The gate electrode 514 has an upper surface insulated by an insulating capping layer pattern 520 and has side walls insulated by insulating spacers 522.

Thereafter, a first interlayer insulating film 530, which may be planarized, is formed on the substrate 502 to cover the transistor 510, and a first contact plug 532 electrically connected to the source region 516 through the first interlayer insulating film 530 and a second contact plug 534 electrically connected to the drain region 518 through the first interlayer insulating film 530 are formed. A conductive pattern is formed on the first interlayer insulating film 530. Then, the conductive layer is patterned to form a source line 536 electrically connected to the source region 516 through a plurality of the first contact plugs 532, and conductive patterns 538 that are spaced apart from each other with the source line 536 therebetween and are electrically connected to a plurality of the drain regions 518 through the second contact plugs 534.

Then, a second interlayer insulating film 540 is formed on the first interlayer insulating film 530 to cover the source line 536 and the conductive patterns 538. By using a photolithography process, portions of the second interlayer insulating film 540 are removed to form lower electrode contact holes 540H exposing top surfaces of the conductive patterns 538. The lower electrode contact holes 540H are filled with a conductive material, and the conductive material is planarized until a top surface of the second interlayer insulating film 540 is exposed to form lower electrode contact plugs 542. In some embodiments, the lower electrode contact plugs 542 may include at least one material chosen from TiN, Ti, TaN, Ta, and W.

Figure 6B:
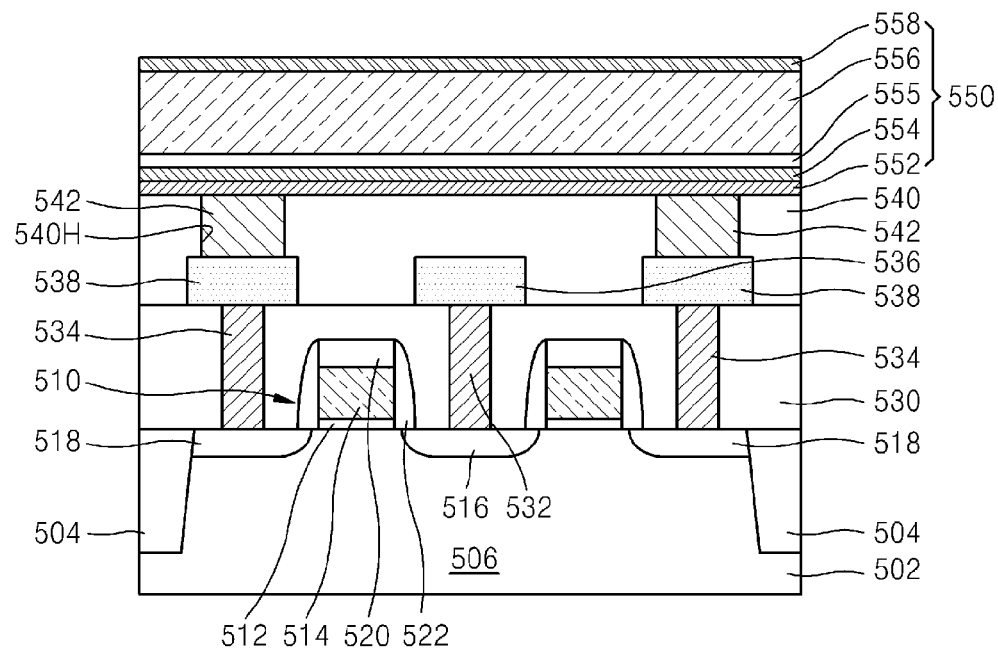

Referring to FIG. 6B, a stack structure 550 is formed on the second interlayer insulating film 540 and the lower electrode contact plugs 542. The stack structure 550 may include a lower electrode layer 552, a lower magnetic layer 554, a tunneling barrier layer 555, an upper magnetic layer 556, and a conductive capping layer 558 which are sequentially stacked.

In some embodiments, the stack structure 550 may be used to form the magnetic body structure 110 of FIG. 1A. However, the inventive concept is not limited thereto, and according to characteristics of a magnetic device to be formed, various other layers may be added or the layers described above may be replaced with other layers.

In the present embodiment, the stack structure 550 may have the same stack structure as the magnetic body structure 110 illustrated in FIGS. 1A to 1C. However, the inventive concept is not limited thereto. For example, the stack structure 550 may have the same stack structure as the magnetic body structure 210 illustrated in FIG. 2, the magnetic body structure 310 illustrated in FIG. 3, or the magnetic body structure 410 illustrated in FIG. 4.

Figure 6C:
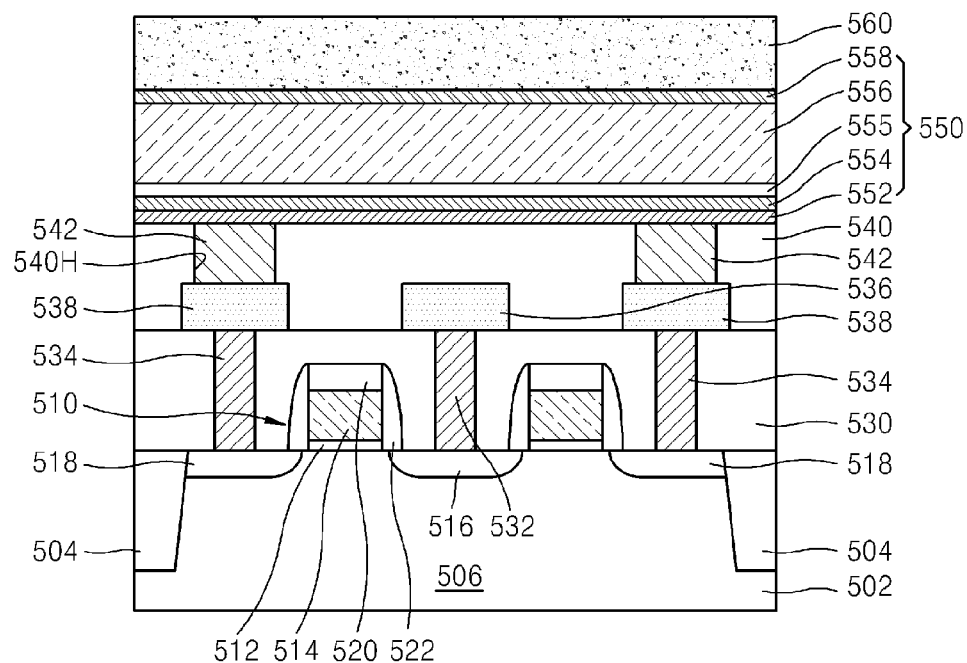

Referring to FIG. 6C, a conductive mask layer 560 is formed on the stack structure 550.

The conductive mask layer 560 may include a metallic glass alloy.

In some embodiments, the conductive mask layer 560 may include a single-layer structure formed of a metallic glass alloy, as described with reference to the conductive pattern 130A illustrated in FIG. 1A. In other embodiments, the conductive mask layer 560 may have a multi-layer structure including a plurality of amorphous layers formed of metallic glass alloy. The plurality of amorphous layers may have different compositions from each other. In some embodiments, as a method of forming the conductive mask layer 560 having a single-layer or multi-layer structure formed of metallic glass alloy, at least one process chosen from a rapid solidification process, a vapor condensation process, a physical vapor deposition (PVD) process, a solid state reaction process, an ion irradiation process, a melt spinning process, a mechanical alloying (MA) process, an atomic layer deposition (ALD) process, and a chemical vapor deposition (CVD) process may be used. As a PVD process, for example, an electron beam evaporation process, a sputtering process, or a pulsed laser deposition (PLD) process may be used. As a CVD process, for example, a thermal CVD process or a plasma-enhanced (PE) CVD process may be used.

In other embodiments, the conductive mask layer 560 may have a multi-layer structure including a first layer including a metallic glass alloy. The conductive mask layer 560 may also include a second layer including crystalline metal, as in the conductive pattern 130B illustrated in FIG. 1B, or in the conductive pattern 130C illustrated in FIG. 1C. In some embodiments, the second layer may include metal or metal nitride. In some embodiments, the second layer may include at least one material chosen from Ru, W, TiN, TaN, Ti, and Ta. For example, the second layer may have a bi-layer structure of Ru/TiN or TiN/W.

The metallic glass alloy of the conductive mask layer 560 may be the same as that of the metallic glass alloy included in the conductive pattern 130A described with reference to FIG. 1A. A metallic glass alloy, which may be an amorphous material, has better hardness and fracture toughness characteristics than a crystalline material. Accordingly, when the conductive mask layer 560 is formed using a metallic glass alloy, the conductive mask layer 560 may have a substantially small thickness compared to a case where the conductive mask layer 560 is formed using a crystalline material. In some embodiments, the conductive mask layer 560 may be formed to have a thickness of about 200 to 500 Å. However, the inventive concept of the present disclosure is not limited thereto, and if necessary, the thickness of the conductive mask layer 560 may be outside of this thickness range.

In some embodiments, the conductive mask layer 560 may include a metallic glass alloy with a hardness of at least 1000 MPa and/or a fracture toughness of at least 10 MPam$^{1/2}$.

Figure 6D:
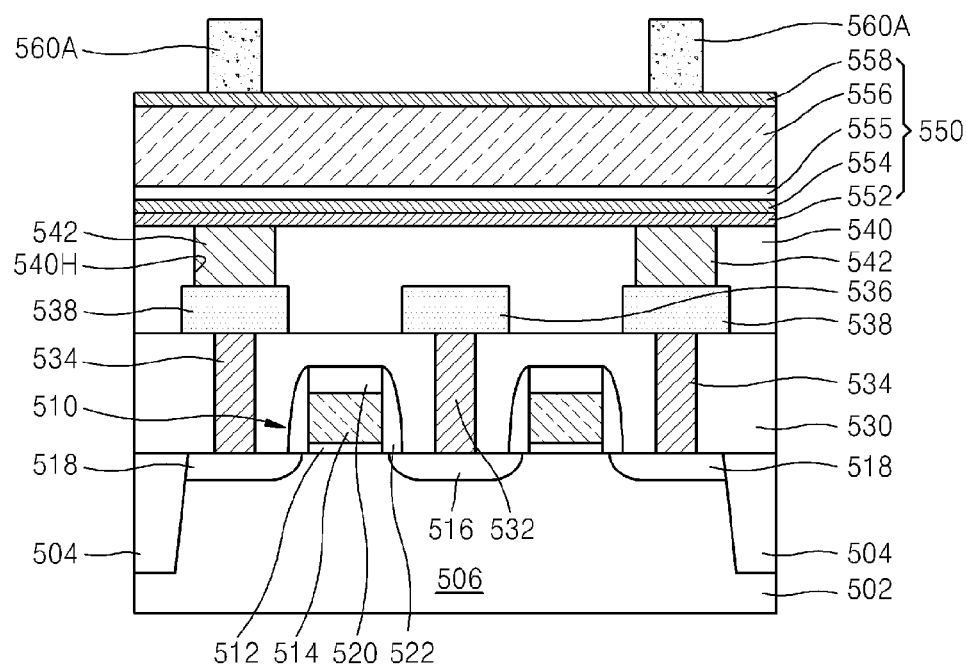

Referring to FIG. 6D, the conductive mask layer 560 is patterned to form a plurality of conductive mask patterns 560A covering portions of a top surface of the stack structure 550.

The conductive mask patterns 560A may be located on the same corresponding axis as the lower electrode contact plugs 542, respectively.

In some embodiments, to form the conductive mask patterns 560A, first, a photolithography process is used to form a plurality of hard mask patterns (not shown) on the conductive mask layer 560 (see FIG. 6C), and then, the conductive mask layer 560 is etched by using the hard mask patterns as an etch mask so that the conductive mask patterns 560A remain.

In some embodiments, the hard mask patterns may be non-metallic hard mask patterns. For example, the hard mask patterns may include at least one element chosen from $ZrO_2$, ZnS, $ZnO_x$ (1≤x≤2), $YBa_2Cu_3O_7$, $TiO_2$, TiN, $Ta_2O_5$, SnO, $Si_3N_4$, $MoS_2$, MgO, InSnO, BN, $B_4C$, $Al_2O_3$, and C. In some embodiments, the hard mask patterns may include as a major or majority component at least one element chosen from $ZrO_2$, ZnS, $ZnO_x$ (1≤x≤2), $YBa_2Cu_3O_7$, $TiO_2$, TiN, $Ta_2O_5$, SnO, $Si_3N_4$, $MoS_2$, MgO, InSnO, BN, $B_4C$, $Al_2O_3$, and C. The major or majority component element may be included in the hard mask patterns in an amount of about 10 to about 80 atom %.

Figure 6E:
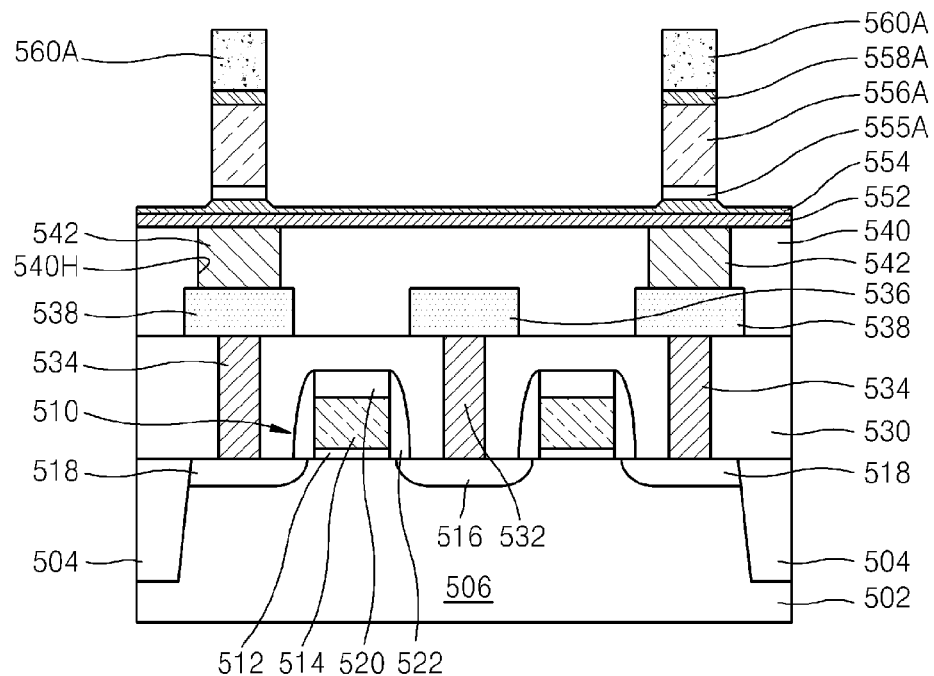

Referring to FIG. 6E, a portion of the stack structure 550 is etched by using the conductive mask patterns 560A as an etch mask.

To etch a portion of the stack structure 550, the resultant structure including the conductive mask patterns 560A is loaded into a plasma etch chamber, followed by plasma etching. In some embodiments, a portion of the stack structure 550 is etched by reactive ion etching (RIE), ion beam etching (IBE), or Ar milling. The stack structure 550 may be etched by using a first etch gas that includes $SF_6$, $NF_3$, $SiF_4$, $CF_4$, $Cl_2$, $CH_3OH$, $CH_4$, CO, $NH_3$, $H_2$, $N_2$, HBr, or a combination thereof. In other embodiments, during the etching of the stack structure 550, at least one first additional gas chosen from Ne, Ar, Kr, and Xe may be used in addition to the first etch gas.

Referring to 6E, a first etch process is performed to etch the conductive capping layer 558, the upper magnetic layer 556, and the tunneling barrier layer 555 of the stack structure 550 to form a plurality of conductive capping layer patterns 558A, a plurality of upper magnetic layer patterns 556A, and a plurality of tunneling barriers 555A.

The first etch process may be formed by using plasma generated from an inductively coupled plasma (ICP) source, a capacitively coupled plasma (CCP) source, an electron cyclotron resonance (ECR) plasma source, a helicon-wave excited plasma source, or an adaptively coupled plasma (ACP) source.

The first etch process may be performed at a temperature of about −10 to about 65° C., and at a pressure of about 2 to about 5 mT. During the first etch process, the conductive mask patterns 560A may be consumed to have a reduced thickness from top surfaces of the conductive mask patterns 560A under the etch atmosphere of the first etch process.

The first etch process may be stopped when the tunneling barriers 555A are formed. Then, an exposed surface of the lower magnetic layer 554 is further etched from its top surface to a predetermined depth. In some embodiments, to determine an end point at which the first etch process is stopped, optical emission spectroscopy may be used. To perform the first etch process using the lower magnetic layer 554 as an end point, the first etch process may be performed until an optical emission spectroscope detects an optical emission wavelength of any one of the elements that constitute the lower magnetic layer 554.

In some embodiments, to form the etch atmosphere of the first etch process, applied source power and bias power are each output in a continuous wave mode in a plasma etch apparatus.

Figure 6F:
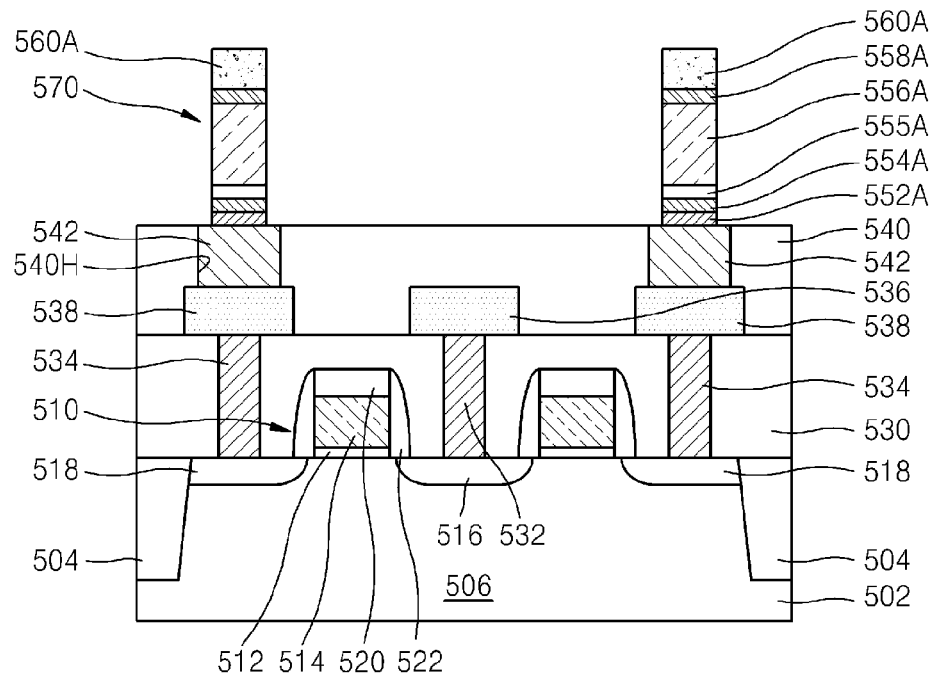

Referring to FIG. 6F, the remaining portion of the stack structure 550 may be etched by using the conductive mask patterns 560A as an etch mask.

To etch the remaining portion of the stack structure 550, the portion of the lower magnetic layer 554 exposed through the conductive mask patterns 560A and the lower electrode layer 552 disposed thereunder of the result of FIG. 6E are etched by using a plasma etch process. This etch process is to be referred to as a second etch process. As a result, a plurality of lower magnetic layer patterns 554A and a plurality of lower electrodes 552A are formed.

The second etch process is substantially the same as the first etch process described with reference to FIG. 6E. The second etch process may be performed using either the first etch gas, or a second etch gas having a composition that is different from that of the first etch gas. The second etch gas may include $SF_6$, $NF_3$, $SiF_4$, $CF_4$, $Cl_2$, $CH_3OH$, $CH_4$, CO, $NH_3$, $H_2$, $N_2$, HBr, or a combination thereof. In some embodiments, during the second etch process, at least one second additional gas chosen from Ne, Ar, Kr, and Xe may be further used in addition to the first etch gas or the second etch gas.

During the second etch process, source power and bias power may each be output in a continuous mode in a plasma etch apparatus. In some embodiments, during the second etch process, source power or bias power may be output in a pulsed mode so that any one of source power and bias power is alternately turned on and off. In other embodiments, during the second etch process, a pulsed-mode source power and a pulsed-mode bias power may be output simultaneously or intermittently output to perform a synchronous pulse plasma etch process. In some embodiments, the output mode of each of the source power and the bias power for the second etch process may be set differently from the output mode of each of the source power and the bias power for the first etch process. For example, during the first etch process, source power and bias power are each output in a continuous mode, and during the second etch process, source power is output in a pulsed mode and bias power is output in a pulsed mode so as to perform a synchronous pulse plasma etch process.

During the second etch process, the conductive mask pattern 560A may be further consumed from the top surfaces thereof under the etch atmosphere of the second etch process so that its thickness is reduced compared to the case illustrated in FIG. 6E. Although not illustrated, during the second etch process, the second interlayer insulating film 540 may be etched by a predetermined thickness from a top surface thereof, which is exposed as a result of the formation of the lower electrodes 552A.

As a result of the second etch process, a plurality of magnetic resistance devices 570 in each of which the lower electrode 552A, the lower magnetic layer pattern 554A, the tunneling barrier 555A, the upper magnetic layer pattern 556A, the conductive capping layer pattern 558A, and the remaining portion of the conductive mask pattern 560A are formed on the lower electrode contact plug 542 are obtained. In the magnetic resistance devices 570, the remaining portion of the conductive mask pattern 560A and the conductive capping layer pattern 558A may function as an upper electrode.

The first etch process described with reference to FIG. 6E and the second etch process described with reference to FIG. 6F may be performed under the same etch atmosphere. Alternatively, the etch atmosphere of the first etch process may be different from that of the second etch process by at least one condition. After the first etch process, the second etch process may be consecutively performed in the same reaction chamber.

During the first etch process described with reference to FIG. 6E and the second etch process described with reference to FIG. 6F, the stack structure 550 may be etched by using the conductive mask patterns 560A including a metallic glass alloy having good hardness and good fracture toughness as an etch mask to form the magnetic resistance devices 570. Accordingly, the stack structure 550 including a magnetic layer is etched by using an etch mask with a thickness that is substantially decreased from that of the prior art etch mask. Also, during an etch process, a dimensional change of a line width of the conductive mask patterns 560A may slightly occur, if at all. Thus, critical dimension (CD) uniformity of the magnetic resistance device 570, which is obtained after the stack structure 550 is etched, may be improved. Also, because the conductive mask patterns 560A, including the metallic glass alloy, are used as an etch mask and the remaining portion thereof is used as an upper electrode, a total thickness of the magnetic device 500 may be reduced.

Figure 6G:
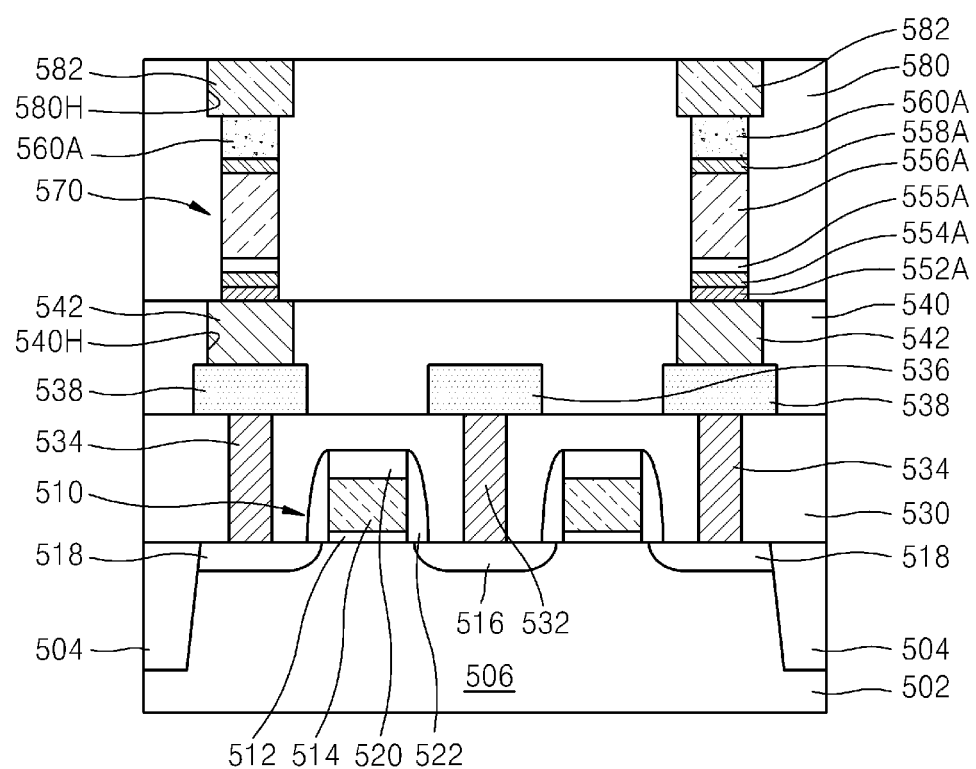

Referring to FIG. 6G, a third interlayer insulating film 580, which may be planarized, is formed to cover the magnetic resistance devices 570, and portions of the third interlayer insulating film 580 are removed to expose top surfaces of the conductive mask patterns 560 of the magnetic resistance devices 570 to form a plurality of bit line contact holes 580H. Thereafter, a conductive layer is formed to fill the bit line contact holes 580H. A planarization process such as chemical mechanical polishing or etch-back is performed thereon until a top surface of the third interlayer insulating film 580 is exposed, thereby forming a plurality of bit line contact plugs 582 in the bit line contact holes 580H, respectively.

Figure 6H:
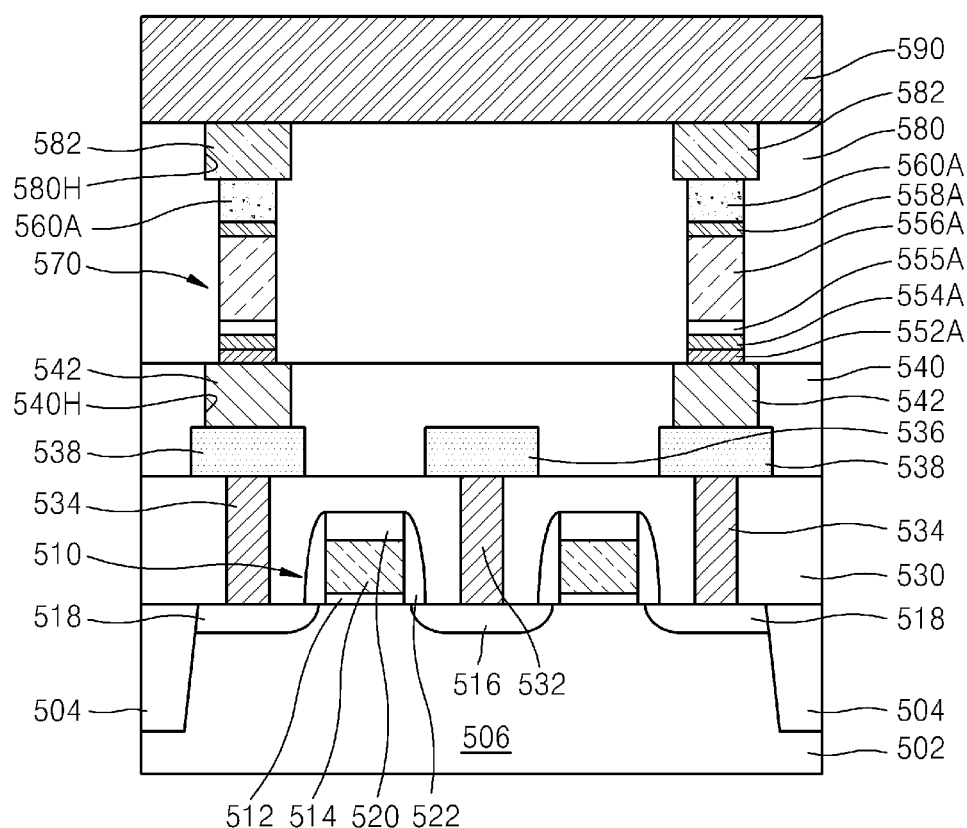

Referring to FIG. 6H, a conductive layer is formed on the third interlayer insulating film 580 and the bit line contact plugs 582. Then, the conductive layer is patterned to form a bit line 590. The bit line 590 may have a line-shape and is electrically connected to the bit line contact plugs 582, thereby completing the manufacture of the magnetic device 500.

Figure 7:
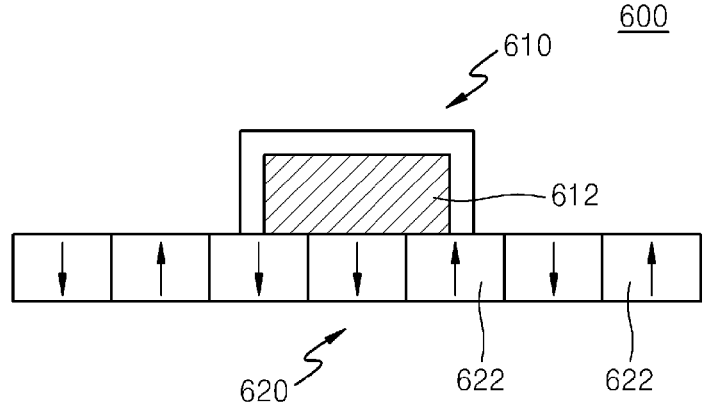
FIG. 7 is a cross-sectional view of a magnetic device according to another embodiment of the inventive concept.

FIG. 7 is a cross-sectional view of a magnetic device 600 according to another embodiment of the inventive concept.

The magnetic device 600 includes a recording head 610 of a hard disk drive (HDD). The recording head 610 includes an MTJ device 612.

Each domain 622 of a recording medium 620 records data by vertical magnetic polarity, as indicated by arrows. The recording head 610 may record data in the recording medium 620 or may read recorded data. The MTJ device 612 may include at least one magnetic device chosen from the magnetic devices 100A, 100B, 100C, 200, 300, and 400 described with reference to FIGS. 1A to 1C and FIGS. 2 to 4.

Figure 8:
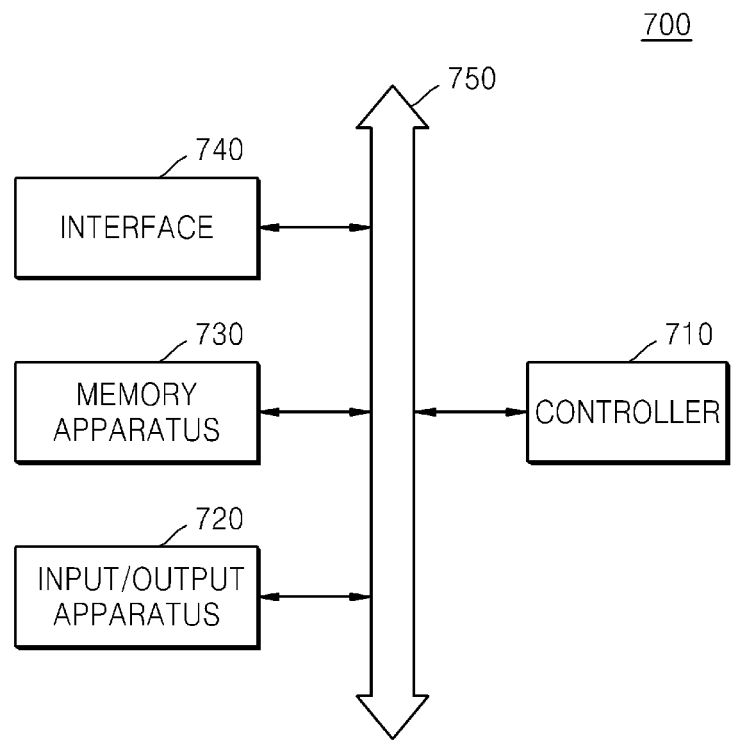
FIG. 8 is a schematic view of a system including a magnetic device according to the inventive concept.
Figure 9:
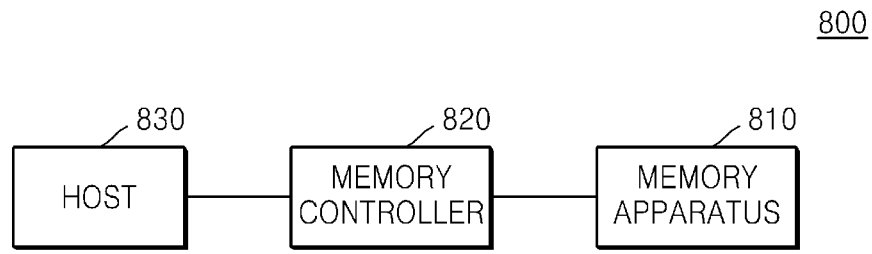
FIG. 9 is a schematic view of a memory card including a magnetic device according to the inventive concept.

FIG. 8 is a schematic view of a system 700 including a magnetic device according to the inventive concept.

The system 700 may include a controller 710, an input/output apparatus 720, a memory apparatus 730, and an interface 740. The system 700 may be a mobile system or a system that may transmit or receive information. In some embodiments, the mobile system may be a personal digital assistant (PDA), a portable computer, a web tablet, a wireless phone, a mobile phone, a digital music player, or a memory card. The controller 710 controls execution of programs of the system 700, and may include a microprocessor, a digital signal processor, a micro-controller, or the like. The input/output apparatus 720 may be used to input data to the system 700 or output data from the system 700. The system 700 may be connected to an external apparatus (not shown), such as a personal computer or a network, through the input/output apparatus 720 and may exchange data with the external apparatus. The input/output apparatus 720 may be, for example, a keypad, a keyboard, or a display.

The memory apparatus 730 may store a code and/or data for the operation of the controller 710 or may store data that has been processed by the controller 710. The memory apparatus 730 may include at least one magnetic device chosen from the magnetic devices 100A, 100B, 100C, 200, 300, 400 and 500 described with reference to FIGS. 1A to 1C, FIGS. 2 to 4, and FIGS. 6A to 6H.

The interface 740 may be a data transmission passage between the system 700 and an external apparatus. The controller 710, the input/output apparatus 720, the memory apparatus 730, and the interface 740 may communicate with each other through a bus 750. The system 700 may be used in a mobile phone, an MP3 player, a navigation device, a portable multimedia player, a PMP, a solid state disk (SSD), or a household appliance.

FIG. 8 is a schematic view of a memory card 800 including a magnetic device according to the inventive concept.

The memory card 800 may include a memory apparatus 810 and a memory controller 820.

The memory apparatus 810 may store data. In some embodiments, the memory apparatus 810 may have a non-volatile characteristic: data is maintained even when a power supply is stopped. The memory apparatus 810 may include at least one magnetic device chosen from the magnetic devices 100A, 100B, 100C, 200, 300, 400 and 500 described with reference to FIGS. 1A to 1C, FIGS. 2 to 4, and FIGS. 6A to 6H.

The memory controller 820 may read data stored in the memory apparatus 810 or may store data in the memory apparatus 810 in correspondence to a read/write request of a host 830.

The principles of the present disclosure can be applied to either in-plane and perpendicular STT-MRAM devices or to combinations of in-plane and perpendicular STT-MRAM devices (e.g., devices in which the free layer has a high perpendicular anisotropy while the equilibrium magnetic moment of the free layer remains in-plane). Thus, the magnetization of the free layer of the STT-RAM devices may be completely or partially in-plane.

The embodiments of the present disclosure may be applied to a variety of other magnetic element or magnetic multilayer structures. A single MTJ or dual MTJ discussed above are, therefore, only some examples of such structures. For example, the principles of the present disclosure may also be applied to any magnetic element having a spin valve, e.g., spin valve STT-MRAM having conductive spacer layers formed of a conductive material such as CR, Ta, Ti, W, and Ru. In addition, the present disclosure can be applied to a ballistic magnetoresistance structure. Also, the principles of the present disclosure may be applied to spin logic devices. The spin logic devices may be, for example, all-spin logic (ASL) device and non-volatile spin logic device.

While the inventive concept has been particularly shown and described with reference to exemplary embodiments thereof, it will be understood that various changes in form and details may be made therein without departing from the spirit and scope of the following claims.

What is claimed is:

1. A magnetic device comprising
   a magnetic body structure comprising a magnetic layer pattern;
   a conductive pattern including a metallic glass alloy and covering at least a portion of the magnetic body structure;
   wherein the metallic glass alloy comprises
   (a) at least one first element chosen from Zr, Pd, Pt, Fe, Cu, Mg, and La and being included in an amount of about 40 to about 80 atom %,
   (b) at least one second element chosen from Si, Cu, Al, Mo, C, P, Ti, Be, and Zr, and being included in an amount of about 10 to about 40 atom %, and
   (c) at least one third element chosen from Cu, Al, Ni, Si, Tb, Co, B, Er, Cr, Mo, C, P, Hf, Ti, Ta, Au, Ag, Ge, Ce, Ca, Gd, Nb, and V, and being included in an amount of about 0.1 to about 10 atom %,
   wherein the first element, the second element, and the third element are different elements.

2. The magnetic device of claim 1, wherein the metallic glass alloy has a hardness of at least 1000 MPa.

3. The magnetic device of claim 1, wherein the metallic glass alloy has a fracture toughness of at least 10 MPam$^{1/2}$.

4. The magnetic device of claim 1, wherein the conductive pattern comprises a first layer including the metallic glass alloy and a second layer including a crystalline metal.

5. The magnetic device of claim 4, wherein the second layer comprises at least one material chosen from Ru, W, TiN, TaN, Ti, and Ta.

6. The magnetic device of claim 1, wherein a width of the conductive pattern is substantially equal to or smaller than a width of the magnetic body structure.

7. The magnetic device of claim 1, wherein the magnetic body structure comprises a lower magnetic layer pattern, a tunneling barrier, and an upper magnetic layer pattern.

8. The magnetic device of claim 1, wherein the magnetic body structure comprises at least one material chosen from Co/Pd, Co/Pt, Co/Ni, Fe/Pd, Fe/Pt, MgO, PtMn, IrMn, a CoFe alloy, and a CoFeB alloy.

9. The magnetic device of claim 1, wherein the magnetic body structure comprises a plurality of magnetic layer patterns and at least one tunneling barrier, and at least one of the magnetic layer patterns has a CoFeB/Ta/CoFeB structure.

10. The magnetic device of claim 1, wherein the magnetic body structure comprises at least two tunneling barriers separated from each other, and
    the at least two tunneling barriers comprise a first tunneling barrier and a second tunneling barrier having thicknesses different from each other.

11. A magnetic device comprising:
    a magnetic body structure comprising a magnetic layer pattern and a tunneling barrier, the tunneling barrier having a first width in a horizontal direction,
    a conductive pattern formed on the magnetic body structure, having a second width substantially equal to or smaller than the first width in the horizontal direction, the conductive pattern including a metallic glass alloy;
    wherein the metallic glass alloy comprises at least one element chosen from Zr, Pd, Pt, Fe, Cu, Mg, and La, and
    the at least one element includes a major component element of about 40 to about 80 atom %.

* * * * *